United States Patent [19]

Cook et al.

[11] 4,012,649

[45] Mar. 15, 1977

[54] PIEZOELECTRIC STRESS/STRAIN INTRUSION DETECTORS

[75] Inventors: John C. Cook, Dallas; James D. Kerr, Allen, both of Tex.

[73] Assignee: Teledyne Industries, Inc., Dallas, Tex.

[22] Filed: Oct. 9, 1975

[21] Appl. No.: 621,110

[52] U.S. Cl. .................................. 310/8.3; 310/8.5; 310/8.7; 340/10; 340/17 R

[51] Int. Cl.[2] .......................................... H01L 41/04

[58] Field of Search .............. 310/8.3, 8.5, 8.6, 8.7, 310/8.9, 9, 9.1; 340/10, 14, 15, 17, 261, 272, 421

[56] References Cited

UNITED STATES PATENTS

| | | | |
|---|---|---|---|
| 3,054,982 | 9/1962 | Kieser | 310/8.7 |
| 3,094,636 | 6/1963 | Gauld | 310/8.1 X |
| 3,239,696 | 3/1966 | Burkhalter et al. | 310/8.6 |
| 3,255,431 | 6/1966 | Howatt | 310/9.1 X |
| 3,284,760 | 11/1966 | Maes | 340/10 |
| 3,286,227 | 11/1966 | Aldrich | 340/10 X |
| 3,336,573 | 8/1967 | Gallaway et al. | 340/17 |
| 3,489,994 | 1/1970 | Massa | 340/10 X |

*Primary Examiner*—Mark O. Budd

*Attorney, Agent, or Firm*—Dowell & Dowell

[57] ABSTRACT

A detector structure and array to be buried in a solid medium either singly or plurally at spaced intervals to detect intrusions such as footsteps upon the surface under which the detectors are buried. Each detector comprises a cup having a diaphragm at one end and a closure at the other end, piezoelectric transducer disc means in the cup and bonded to the diaphragm, the diaphragm being large enough in diameter to achieve good coupling to the medium in which it is buried, especially if it is a particulate medium such as ground soil. A cable joins the cup units, and sealing means are provided for the cup and cable entrance to seal against entry of moisture. Successive detector units may be coupled to the cable with reversed polarities to cancel out frontal disturbances such as seismic events.

6 Claims, 3 Drawing Figures

PIEZOELECTRIC STRESS/STRAIN INTRUSION DETECTORS

FIELD OF INVENTION

This invention relates to detectors of the piezoelectric type either individually or arranged in an array including multiple spaced discrete detector units suitable to be buried in a solid medium, such as the earth, and responsive to stressing of that medium to generate and deliver output signals along cable means which interconnect the discrete detector units.

BACKGROUND AND PRIOR ART

The guarding of large areas against intrusion always presents a considerable problem despite the many systems already developed for accomplishing this purpose. For example, in the case of international borders, the expense of installing an effective system is a major consideration. Another persistent problem stems from the need to make sensitive detection means which do not at the same time deliver excessive numbers of false alarms attributable to spurious stimulations, for instance, by induced fields from power lines or storms, by natural seismic activities, by the presence of wild animals, and by aging and drifting of electrical components forming part of the system.

There are a number of systems which employ an array of elements which must be excited by a specially generated signal, i.e., tuned bridge circuits. There are field radiating systems in which disturbances of the generated field by motion therewithin is detected. There are systems in which transducers detect stress-induced strain using piezoelectric transducers, for example, Laurent, U.S. Pat. No. 3,489,995; McCarty U.S. Pat. No. 2,745,085 and Turner U.S. Pat. No. 3,287,692. Other transducers comprising piezoelectric units are shown, for instance, in Gillespie U.S. Pat. No. 2,477,246; Massa U.S. Pat. No. 2,967,957; Hansell U.S. Pat. No. 2,430,013; Nesh U.S. Pat. No. 3,167,668; and Brunnert U.S. Pat. No. 3,708,702. The present invention is an intrusion detector of the piezoelectric strain-sensing type which seeks to provide an improved signal generating detector configuration for use in an array of individual detector units buried in the earth.

THE INVENTION

The present invention teaches a structure for a signal generating detector unit suitable for use in a buried array, each of the discrete detector units comprising a piezoelectric generator means capable of generating an electrical signal when disturbed. The discrete generating units are similar to each other, and each comprises at least one diaphragm-like disc forming one outer surface of a cup-shaped structure and having a piezoelectric disc bonded to and occupying a central portion of the diaphragm disc inside the cup, the diameter of the diaphragm being large as compared with sizes of particles which might be found in the medium in which the cup is buried, i.e., pebbles in the earth, whereby the larger area of the diaphragm provides the transducer with improved coupling to the soil in which it is buried. This is a problem which is significant where the transducer is buried in earth as compared with, for instance, marine transducers where the medium in which the transducer is immersed is homogeneous. Each discrete generating unit passes the cable which interconnects it through the side walls of its cup structure using moisture proof strain relief seals, the cable being preferably of the coaxial type and having its braided outer conductor grounded to the cup which is bonded to one electrode of the piezoelectric disc. The other electrode is coupled to the center conductor of the cable. The diaphragm is stiff, but deformable under pressure, being made of metal, ceramic, glass or plastic, and is supported around its edges by the rigid protective structure of the side walls of the cup, within which there is provided an air space. When the diaphragm is deformed by an increase in soil pressure, i.e. dished, it stretches the piezoelectric disc element radially and this deformation is accompanied by a reduction in thickness of the piezoelectric disc element and the generation of a signal voltage across it. This particular configuration makes an extremely sensitive generator, so that only a very small deformation of the diaphragm is necessary in order to induce a strong signal in the cable.

In an elongated array in which a substantial number of discrete generator units are mutually spaced and individually sensitive to strain, the sensitivity of the array to force fields applied to the earth's surface thereabove varies somewhat depending upon how nearly the force is applied directly above a detector unit. The useful zone of surface detection is several times as large in diameter about a detection unit as the depth at which the unit is buried, but its sensitivity is inversely proportional to the square of that depth assuming the earth to have been properly and uniformly compacted above the array after burial.

A number of these circular discrete detector units are conveniently joined together by the cable means passing through them. These discrete detector units should be mutually spaced apart by substantial spacings of, for instance, about equal to the depth at which the unit is buried, in order to make an array thereof which is economical to deploy. In arrays being built and tested at present, the discrete detector units are about one and five-eighths inches in diameter, and are spaced apart by about two or three feet when buried at a two or three foot depth, although other spacings and depths can be used depending upon application and type of earth they are buried in. Moreover, it is possible for successive units to be so connected with regard to their polarities that they tend to cancel out spurious signals attributable to stray fields in the vicinity, or extraneous seismic disturbances, but so that they do not cancel out localized pressure signals, i.e., the near field of a disturbance attributable to a footstep on the surface of the earth in which the detector array is buried.

It is a principal object of this invention to provide a piezoelectric detector configuration in which the diaphragm is shaped, supported, and oriented with respect to the cup structure, and in which the piezoelectric element is attached thereto in such a way as to provide optimum sensitivity for a buried detector unit. Although it is not proven possible to make a generating unit responsive only to stress, it is the object of this invention to provide a unit which approaches this goal by virtue of its improved sensitivity to small strain displacements.

It is another object of this invention to provide an improved configuration for a strain-responsive detector which lends itself to being protected from deterioration during long intervals of burial in the earth. More specifically, the present strain detector is provided with sealing means which can comprise a jacket means in the form of a flexible plastic coating which conforms to the contours of the detector, and/or which includes potting means partially filling each cup and covering the connecting portions of the cables thereadjacent for sealing them against entry of moisture, these sealing means being such that they do not interfere with efficient operation of the detector to produce a signal in response to a disturbance applied at the surface of the earth.

Still another object of the present invention is to provide a detector string comprising a number of discrete detector units supported in mutually spaced relationship on cable means in an array which is highly flexible so as to permit it to be buried in the earth without damage, especially while the earth is being compacted above the array after burial thereof, which is of course necessary to conceal the fact that a detector is buried at the location and is also very necessary in order to provide good coupling of a force applied at the surface of the earth to produce strain at the level where the transducer is buried.

Still another object of the invention is to provide an improved structure for piezoelectric detector units in an array which is to be buried, wherein the cup-shaped configuration of the supporting diaphragm is such as to provide excellent protection from damage to the piezoelectric element within the cup, such damage being an ever present hazard during the operation of burying the array in the ground and compacting the earth above it. The use of the present invention is not confined to burial in the earth. These detectors are currently used embedded in concrete slabs, asphalt paving or even ice which is also a solid medium.

It is a major object of this invention to provide an economically manufacturable structure for discrete detector units which can be used individually or arranged in spaced relationship at intervals along the cable of an array. In the illustrative embodiment of the present invention each detector unit comprises an inexpensive cup-like housing of which the diaphragm is a part, an inexpensive commercially available piezoelectric element generally comprising a lead titanate-zirconate disc polarized through its thickness and having electrodes bonded to it, and such cements, cable entrance ferrules and plastic sealants as are required to mount, connect, and waterproof the parts. There are no parts which are difficult or expensive to make or assemble, and this low cost feature is a very important consideration, because international border detectors must be buried by-the-mile, and the cost per unit-length is accordingly considered to be a primary factor in a practical situation. A detector unit of high sensitivity permits fewer units in an array, spaced further apart, and buried deeper in the ground. Greater burial depth up to a point is important because it means wider surface coverage for each unit, since the diameter of surface coverage for each unit varies about proportionally with the burial depth. It should also be noted that a larger diameter of surface coverage affects not only the maximum linear spacings possible for adjacent discrete detector units, it also provides greater surface area coverage in directions normal to the linear extent of the array. Very shallow burial, which would be required for insensitive detector units, means a zone of sensitivity extending only a short way on either side of the array, thereby increasing the risk that a person may simply step over the array and create no indication of his presence. There are many ways of connecting the units with regard to their polarities. For example, it may be desirable to connect the units so that each array comprises a sequence of alternately reversed-polarity generators. This periodic reversal of the generator units with regard to their polarity serves the purpose of reducing the effect on the overall array caused by distant disturbances which tend to excite an array having all of its polarities connected in the same sense to deliver a false signal. It should also be noted that this periodic reversal of the polarities has the effect of reducing the likelihood that a seismic disturbance of distant origin will set off false alarm signals in the array. A low frequency seismic wave is a very long-wave phenomenon which arrives at an array from a distant source in such a manner as to stress the ground uniformly over a large area, causing half of the generator units to deliver a signal of one polarity and the interspersed remainder of the units to deliver a similar signal but of oppositing polarity. Conversely, a stress attributable to a near-field component such as a human footstep above the array will affect adjacent units differently since the stress attributable to the footstep is highly localized, not broadly frontal. Therefore, the output signals from the reversed units will be much less likely to cancel, except when the source is located exactly between two detector units. Alternate reversal of polarity is mentioned herein only as an example. There are many other possible interconnections of the individual transducer units which could be used instead to produce other results. The likelihood of response by the array to spurious disturbances can be further reduced by coupling the outputs of the generating units through differential amplifier circuits which tend to cancel common-mode signal components appearing on the wiring coming from any of the detector units.

Other objects and advantages of the invention will become apparent during the following discussion of the drawings, wherein a practical embodiment is illustrated.

THE DRAWINGS

Figure 1:
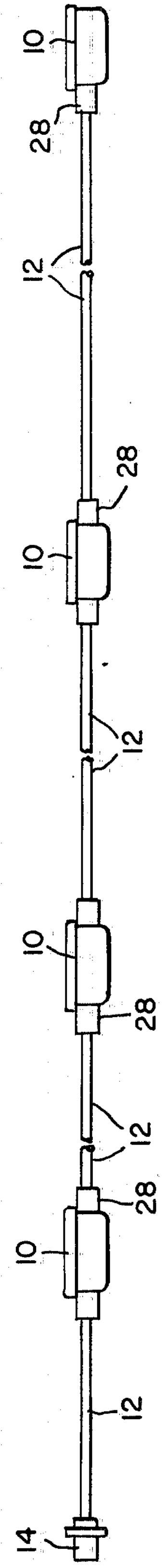
FIG. 1 is an elevational view of an array according to the present invention comprising multiple discrete detector units coupled together by a cable on which the units are mounted and spaced.

Referring now to the drawing, FIG. 1 shows an array of discrete detector units 10 mounted on an interconnecting coaxial cable 12 which carries at one end a cable connector 14 suitable for plugging the array into a suitable electronic amplifier (not shown) which would be part of an intrusion alarm system.

Figure 2:
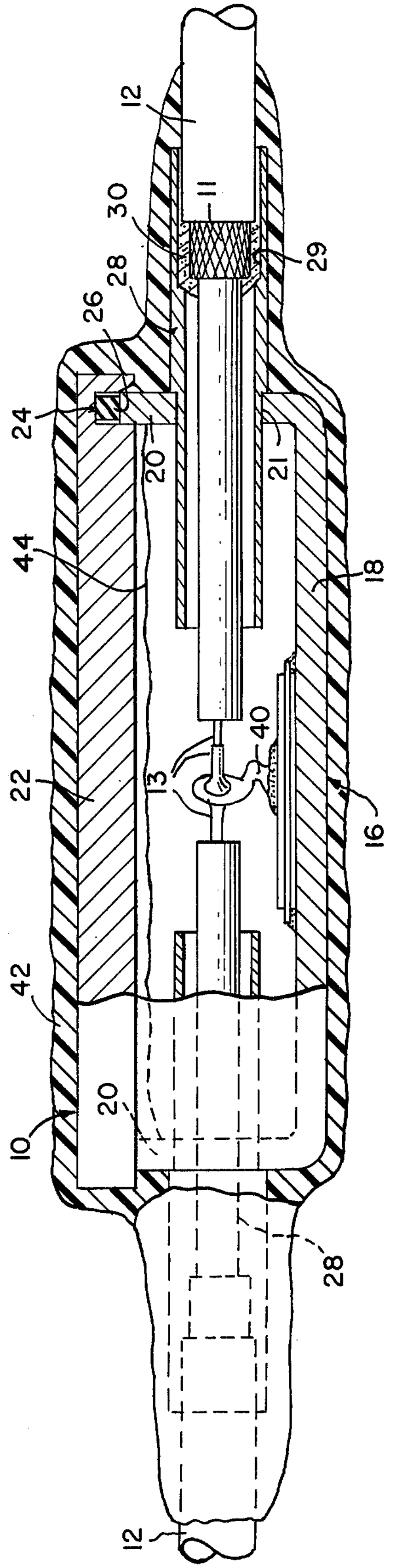
FIG. 2 is an enlarged cross-sectional view through a detector unit taken in a plane including the axis of the unit.

FIG. 2 shows an elevation view partly in cross-section of a typical embodiment of a detector unit 10 which comprises a metal cup 16 having a diaphragm portion 18 and an annular side wall portion 20 which in the present embodiment is integral with the diaphragm portion 18. The cup 16 is closed by a cap 22 which has an annular groove 24 in one face into which the upper rim of the side wall portion 20 is a press fit. An O-ring 26 is compressed in the groove 24 to provide a moisture seal. The side wall portion 20 of the cup has two diametrically opposite holes 21 though which metal ferrules 28 are passed, the ferrules being soldered to the side walls and having a stepped bore therethrough including an outer enlarged portion 29 to receive the braid 11 of the coaxial cable 12 which is bonded by a conductive adhesive 30 to the enlarged portion 29 of the ferrule, which may also be mechanically crimped onto the cable to clamp it before the adhesive 30 has hardened.

Figure 3:
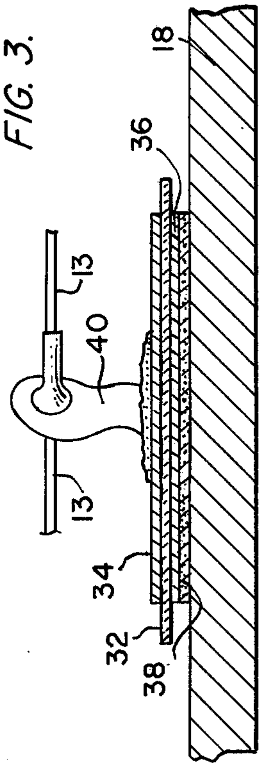
FIG. 3 is an enlarged cross-sectional view through the piezoelectric transducer showing its attachment to the diaphragm portion of the detector unit shown in FIG. 2.

Within the cup 16 is located a piezoelectric transducer element of well known type comprising a ceramic disc 32 polarized through its thickness having silver coatings 34 and 36 on both sides, which coatings act as electrodes charged by the ceramic when the diaphragm 18 is flexed. The lower silver coating 36, see FIG. 3, is cemented to the diaphragm 18 by a conductive epoxy cement 38 so that the cup 16 and the braid 30 of the cables become one terminal for the transducer. The upper silver coating 34 is the other terminal for the transducer and has a metallic tab 40 made of foil or wire connected to it by conductive epoxy cement. This tab 40 is provided at its upper end with a hole through which the center conductor wires are passed and then soldered to the tab to complete the cable connections. Each piezoelectric transducer is tested for polarity before mounting on the diaphragm, and the positive silver electrode (for instance 34) is marked. Thus, in the unit illustrated in FIG. 2, upward flexure of the diaphragm will cause a positive signal on the cable conductor 13. An oppositely poled detector unit can be made by bonding the coating 34 to the diaphragm 18 and connecting the negative silver electrode 36 to the conductor 13. This technique, as well as the ceramic transducer itself, is well known in the prior art. After the detector unit 10 is completed by pressing the cap 22 in place, the whole unit and the adjacent ends of the cable 12 are covered by a plastic jacket, preferably a coating, to seal them against penetration of moisture into the unit. Internal potting of each detector unit is also a good way to prevent moisture degradation of the unit, such potting (not shown) being applied to cover the piezoelectric transducer unit, tab 40, the inner conductor 13 and the inner ends of the cable insulation. However, the potting must not fill the cup completely, but must leave an air space, for instance above the line 44 which represents the top pottng material, which is not shown in cross-section because the hatching would obscure the other parts.

It is recognized that the general concept of cementing a piezoelectric transducer, a purchased item, to a diaphragm disc is well known as shown in the prior art mentioned above, wherein there is illustrated a type of detector useful in a homogeneous medium such as water in which the detector is immersed, or such as air in the case of a microphone. However, the present application involves burying the detector unit in a particulate non-homogeneous medium in which coupling between the medium and the transducer is inclined to be uncertain. The piezoelectric transducers used in the present detector units are only about one-half inch in diameter. If the diaphragm 18 and cup 10 were only slightly larger in diameter, snugly accommodating the transducer, such a unit when buried would be about the size of a pebble, and its coupling to the soil would be rather variable when the soil is replaced on top of the array in a ditch. It is therefore a characteristic of the invention that the transducer is fixed to a larger diameter diaphragm, i.e., at least twice and preferably three times its diameter, so that the forces on the diaphragm will be integrated over an area which is large as compared with the size of any soil particles or pebbles likely to be included in it. This size of cup and diaphragm not only provides good force coupling with the soil, but also provides a cup which can be properly oriented with its axis disposed vertically so as to orient its maximum sensitivity in the direction of any surface disturbance. The presently manufactured cups are about one and five-eighths inches in diameter. This diameter provides adequate coupling without being wastefully large. Moreover it fits easily within a two inch wide trench dug by a standard water-sprinkler system trencher machine. The depth of burial appears optimum within a range of 18 inches to 3 feet in ordinary soil or sand, and the spacing between adjacent units on the cable should be about equal to the depth selected. Burial at too great a depth for the type of soil, for instance too deep burial in clay, results in loss of sensitivity to pressure disturbances applied at the surface of the ground above the array.

This invention is not to be limited to the exact form shown in the drawing, for obviously changes can be made within the scope of the claims.

We claim:

1. A detector suitable for use in an array to be buried below the surface of the earth and connected by coaxial cable means to circuitry to detect intrusions which apply downward pressures to said surface above the array, comprising:

a. a metallic cup having an enclosing side wall portion open at one end and closed at the other end by a diaphragm portion, the side wall portions having one or more cable-receiving openings therethrough;
b. cap means closing said open end of the cup;
c. piezoelectric transducer disc means having oppositely poled electrodes and one of the electrodes of said disc means being conductively bonded to the diaphragm portion inside the cup for deformation of the disc means therewith when the diaphragm portion is flexed by said pressures;
d. said cable means passing into the cup via a side wall opening, and the cable means having an outer conductor conductively coupled to the cup and having an inner conductor coupled to the other of said oppositely poled electrodes inside the cup;
e. strain relief means comprising a hollow ferrule extending through each opening and fixed in the side wall of the cup and leading thereinto, and the cable means passing through a ferrule and fixed thereto; and
f. sealing means for sealing the cup and the portions of the cable means entering said ferrules against entry of moisture.

2. The detector as set forth in claim 1, wherein said other electrode of each disc means has a flexible metallic tab attached to it, and said tab is conductively coupled to the inner conductor of said coaxial cable means.

3. The detector as set forth in claim 1, wherein said sealing means comprises potting means partially filling said cup.

4. The detector as set forth in claim 1, wherein the cup has an air space therewithin, and said sealing means comprises a jacket of moisture impervious flexible material covering the cup and the adjacent ends of the cable means and sealed thereto.

5. The detector as set forth in claim 1, wherein the piezoelectric disc means is less than an inch in diameter and the diaphragm portion of the cup is at least twice the diameter of the disc means.

6. The detector as set forth in claim 1, wherein said diaphragm portion is made of sheet metal, glass, plastic or ceramic.

* * * * *